(12) United States Patent
Tam et al.

(10) Patent No.: US 9,609,791 B2
(45) Date of Patent: Mar. 28, 2017

(54) SEAWATER FARADAY CAGE

(71) Applicants:Daniel Wing Shum Tam, San Diego, CA (US); Lu Xu, San Diego, CA (US); Diana Arceo, San Diego, CA (US)

(72) Inventors: Daniel Wing Shum Tam, San Diego, CA (US); Lu Xu, San Diego, CA (US); Diana Arceo, San Diego, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/963,464

(22) Filed: Dec. 9, 2015

(65) Prior Publication Data

US 2016/0157395 A1   Jun. 2, 2016

Related U.S. Application Data

(62) Division of application No. 14/038,942, filed on Sep. 27, 2013, now Pat. No. 9,241,432.

(51) Int. Cl.
*H05K 9/00* (2006.01)

(52) U.S. Cl.
CPC ......... *H05K 9/0081* (2013.01); *H05K 9/0001* (2013.01)

(58) Field of Classification Search
CPC .................................................. H05K 9/0081
See application file for complete search history.

(56) References Cited

U.S. PATENT DOCUMENTS 5,362,353 A   11/1994 Mallon
5,592,391 A   1/1997 Muyshondt et al.
5,761,053 A   6/1998 King et al.
6,356,815 B1   3/2002 Wu et al.
6,653,557 B2   11/2003 Wolf et al.
9,081,106 B2 *   7/2015 Peppe ....................... G01V 3/00
2010/0128456 A1 *   5/2010 Hughes ................ H05K 9/0045
361/818
2013/0052904 A1 *   2/2013 Pothoven .............. H01J 65/044
445/58

OTHER PUBLICATIONS

Unknown, "Frying Tonight", The Economist, Oct. 15, 2011, www.economist.com/node/21532245.
Tam, Daniel Wing Shum et al., "Seawater Faraday Cage", Unpublished U.S. Appl. No. 14/038,942, filed Sep. 27, 2013.

* cited by examiner

*Primary Examiner* — Hung V Ngo
(74) *Attorney, Agent, or Firm* — SSC Pacific Patent Office; Arthur K. Samora; Kyle Eppele

(57) ABSTRACT

A method for deploying a lightweight, flexible Faraday cage around a device can include the step of directing the conductive fluid flow in a manner that causes a shroud to form over the device. In some embodiments, a flexible material such as canvas can be deployed over the device and the conductive fluid can be sprayed onto the flexible material to form the shroud. In other embodiments, a plurality of nozzles can be placed around the perimeter of the device, and the nozzles can be directed at a predetermined point over the device. The streams can meet at the predetermined point, collide and thereby provide the conductive shroud for the device. The shroud can have a skin depth, which can be chosen according to the desired frequency of electromagnetic radiation to be blocked, typically from one to one hundred millimeters (1-100 mm).

8 Claims, 5 Drawing Sheets

SEAWATER FARADAY CAGE

This application is a divisional application of U.S. patent application Ser. No. 14/038,942, filed Sep. 27, 2013 by Daniel W. Tam et al., for an invention entitled "Seawater Faraday Cage". The '942 application is assigned to the same assignee as the present invention.

FEDERALLY-SPONSORED RESEARCH AND DEVELOPMENT

This invention (Navy Case No. 103889) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619) 553-5118; email ssc par T2@navy.mil.

FIELD OF THE INVENTION

The present invention pertains generally to the design of Faraday cages. More specifically, the present invention pertains to methods for designing Faraday shields that use conductive fluids to protect vessel communications and sensors from the damaging effects caused by radiation and natural lightning.

BACKGROUND OF THE INVENTION

A Faraday cage is a shield formed by conducting material such as metal to protect the enclosure from external electromagnetic radiations. When an external electrical field is present, the Faraday cage prevents the electric field from penetrating within the cage. If the cage is grounded, the excess charge will flow to ground instead of residing on its outer surface. Traditionally Faraday cages are made of copper, aluminum foil or other metals.

Typically, the effectiveness of the Faraday cage in prevent electromagnetic radiation from passing through is dictated by the conductivity of the cage material and the thickness of the metal. Because Faraday cages are typically made of metal, and/or a metal mesh incorporated within a matrix, they are bulky and difficult to move around. Furthermore, it is not practical to implement a traditional Faraday cage on a ship to shield the whole ship and its antennas due to size and weight constraints. Additionally, a Faraday cage will prevent the passage of electromagnetic radiation through the cage in both directions, both inbound and outbound. Although there are times when a vessel may want to protect itself from inbound electromagnetic radiation, there is also a need for a vessel to selectively emit radio waves, radar emissions, etc. in the conduct of its daily operations. Thus, it is also desirable to have a Faraday cage which can be selectively activated and deactivated.

In view of the above, it is an object of the present invention to provide a Faraday cage and method for deployment, which uses seawater to provide the shielding effect. Another object of the present invention is to provide a Faraday cage and method for deployment that is extremely lightweight relative to the amount of area/volume it is designed to protect. Still another object of the present invention is to provide a Faraday cage and method for deployment that can be selectively activated and deactivated. Another object of the present invention is to provide a Faraday cage and method for deployment where the size and corresponding area of coverage can be adjusted during operation of the Faraday cage. Yet another object of the present invention is to provide a Faraday cage whose protective properties can be adjusted according to the level of electromagnetic radiation desired by the user. Another object of the present invention is to provide a Faraday cage and method for deployment that is easy to use in a cost-efficient manner.

SUMMARY OF THE INVENTION

A method for deploying a lightweight, flexible Faraday cage around a device can include the initial steps of establishing a flow of conductive fluid, and directing the conductive fluid flow in a manner that causes a shroud of conductive fluid to form over the device. In some embodiments, a flexible material such as canvas can be spread over an umbrella-like skeletal structure, and the conductive fluid can be sprayed onto the flexible material to form the shroud around the device. The shroud of conductive fluid can have a thickness to thereby establish the attenuation or shielding effect with respect to the device.

The flexible material can also be divided up into portions, which can be placed over the device, so that a first portion is over the device and a larger second portion of flexible material is over the first portion. A flow of conductive fluid can then established over both the first portion and the second portion to form multiple shrouds having first and second thickness, so that the shrouds can appear to be concentric when viewed in plan view. In still other embodiments, a plurality of nozzles can be placed around the perimeter of the device, and the nozzles can be directed at a predetermined point over the device. When conductive fluid flow is established through the nozzles, the streams can meet at the predetermined point and collide to thereby establish the conductive shroud for the device.

For all of the above embodiments, the shroud(s) can have a thickness, which can be chosen according to the desired frequency of electromagnetic radiation to be blocked. Typically, the thickness(s) can be from one to one hundred millimeters (1-100 mm). The shroud can be formed from any conductive fluid, such as tap water, saltwater, seawater or distilled water, for example.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

In brief overview, the seawater Faraday cage of the present invention according to several embodiments can take advantage of the electrical conductivity of the sodium and chloride ions in seawater to create a flexible type of Faraday cage or shield. The conductivity of the seawater can determine the performance of the shielding effectiveness. By using a seawater Faraday cage instead of a traditional metal shielding cage, the weight can be significantly reduced. The seawater Faraday cage can also be selectively activated and deactivated to avoid interfering with other operations (outward electromagnetic emissions such as radar and radio waves). The fact that seawater can be easily accessed from ocean can render a seawater Faraday cage very useful for Naval vessel applications.

In cases where it can be desirable to block electromagnetic radiation from impinging on a ship (or any other device or structure), a flow of conductive fluid can be manipulated to establish a shroud of seawater, which can cover the whole ship or any sections thereof, or any device 10 that is mounted on the skin of the ship, and can prevent any damaging effect due to incoming electromagnetic radiation. The shroud of seawater can create the Faraday cage. The thickness of the shroud required can depend on the electrical properties of seawater. The electrical properties of seawater vary in frequency, temperature, and salinity.

Figure 1:
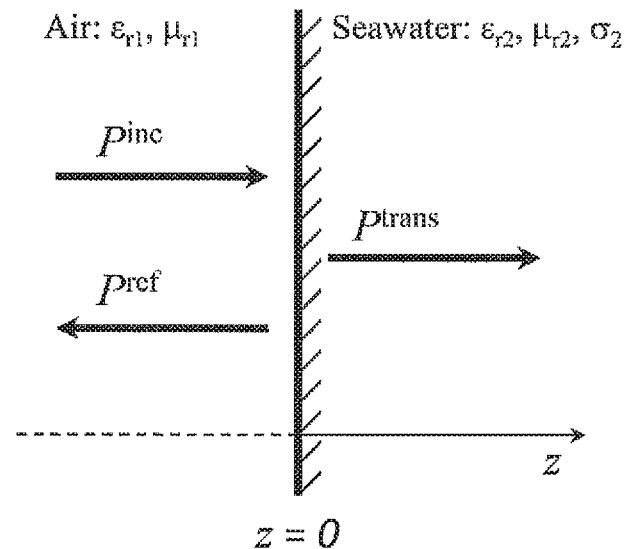
FIG. 1 is a diagram showing the relationship between an incident power wave, $P^{inc}$, reflected power wave, $P^{ref}$, and transmitted power wave, $P^{trans}$ at normal angle between two semi-infinite mediums: air and seawater.

FIG. 1 is an illustration showing a power wave traveling in air at normal incidence that encounter a seawater interface. At incidence, a fraction of the power wave will reflect back into the air and the other part will be transmitted into the seawater. The power wave transmitted into the seawater will be attenuated by the properties of seawater as the power wave propagates through the medium. This power loss is known as the attenuation loss and the loss due to the reflected power is known as the transmission loss. The ratio of the power transmitted into the seawater and the incident power in air is given by equation (1):

$$\frac{P^{trans}}{P^{inc}} = \underbrace{e^{(-2\alpha z)}}_{\text{Attenuation Loss}} \underbrace{|T|^2 \eta_1 Re\left(\frac{1}{\eta_2^*}\right)}_{\text{Transmission Loss}}. \quad (1)$$

where $\alpha$ is the attenuation constant in Nepers per meter (Np/m), Re is the real number component, $\eta_1$, is the intrinsic impedance of air (ohms), $\eta_2$ is the intrinsic impedance of seawater (ohms), z is the distance inside the seawater (m), and T is the transmission coefficient. The transmission coefficient is calculated by equation (2):

$$T = \frac{2\eta_1}{\eta_1 + \eta_2}. \quad (2)$$

The intrinsic impedance is given by $$\eta = \sqrt{\frac{j 2\pi f \mu}{\sigma + j 2\pi f \varepsilon}}, \quad (3)$$

Where j is the imaginary component part, f is the frequency in Hz, $\mu$ is the permeability, $\epsilon$ is the permittivity, and $\sigma$ is the conductivity. The permeability can be expressed as the product of the permeability of free space and the relative permeability of the material, $\mu = \mu_0 \times \mu_r$, where $\mu_0 = 4\pi \times 10^{-7}$ 1 H/m and $\mu_r$ is the relative permeability. For air and seawater, $\mu_r = 1$. The permittivity can be expresses as the product of the permittivity of free space and the relative permittivity of the material, $\epsilon = \epsilon_0 \times \epsilon_r$, where $\epsilon_0 = 8.854 \times 10^{-12}$ f/m and $\epsilon_r$ is the relative permittivity. For air $\epsilon_r = 1$ and $\epsilon_r$ varies for seawater. Air is a dielectric and therefore has a conductivity of zero while the conductivity of seawater varies. The intrinsic impedance of air, $\eta_1$, is therefore, 377Ω. The attenuation constant is calculated using equation (4):

$$\alpha = 2\pi f \sqrt{\mu_2 \varepsilon_2} \left\{ \frac{1}{2} \left[ \sqrt{1 + \left(\frac{\sigma_2}{2\pi f \varepsilon_2}\right)} - 1 \right] \right\}^{1/2}. \quad (4)$$

The conductivity and permittivity of sea water vary, however, using a typical conductivity value of 4 Siemens per meter (S/m, where a Siemen is the inverse of an Ohm, S=1/Ω) and relative permittivity value of 81, the attenuation loss and transmission loss is calculated to demonstrate the blockage effect for seawater.

Figure 2:
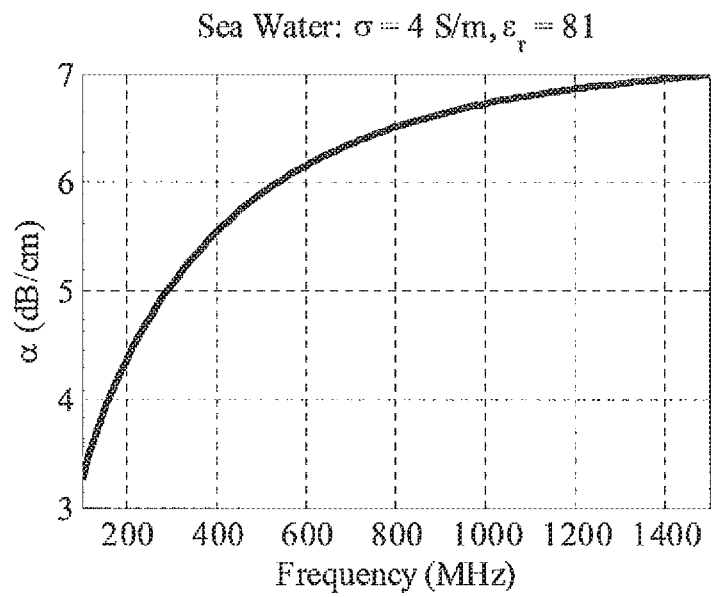
FIG. 2 is a graph of the attenuation loss for a propagating wave in seawater.
Figure 3:
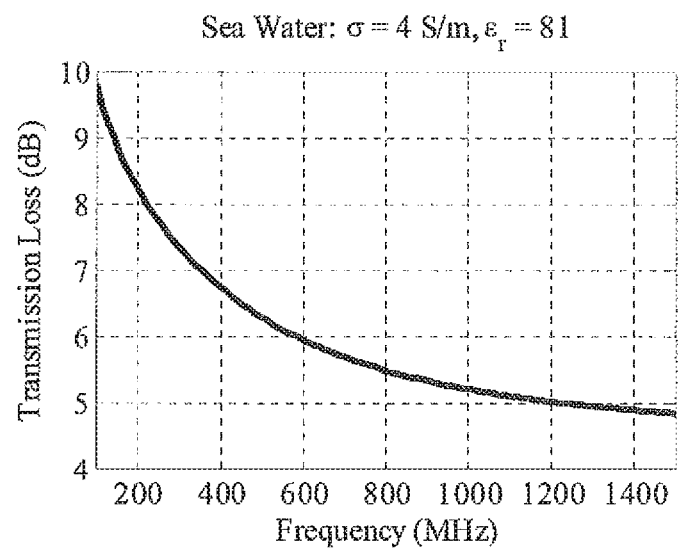
FIG. 3 is a graph of the transmission loss from a power wave traveling from an air medium to seawater.
Figure 4:
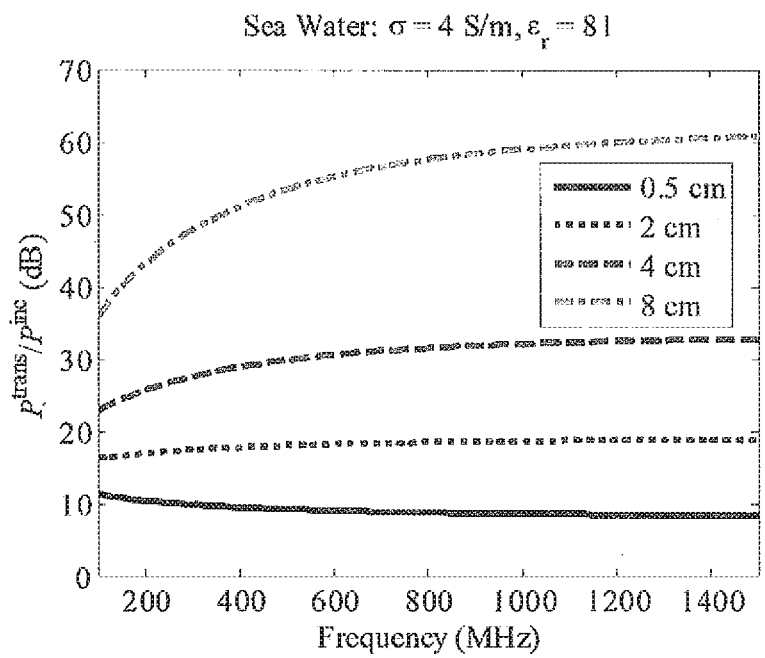
FIG. 4 is a graph of the total loss for various distances into the seawater.

FIG. 2 is a plot of the attenuation loss in dB/cm versus frequency. The plots shows that the attenuation loss increases as the frequency increases and the amount of attenuation may be controlled by varying the shroud wall thickness. FIG. 3 is a plot of the transmission loss versus frequency. As can be seen from FIG. 3, the transmission losses decrease as the frequency increases. These plots can be used to design the shroud wall thickness required for various frequencies and required shielding effect (it should be appreciated that the same analysis could be conducted for salt water, tap water, distilled water or any other conductive fluid, provided the conductivity and permittivity of the conductive fluid is known). FIG. 4 is a plot showing the total loss (absorption and transmission) for various distances inside the seawater. In addition to this analysis, surface roughness and additional transmission loss due to the finite thickness of the shroud needs to be considered in enactment.

In cases where multiple shrouds can be envisioned, the spacing between each shroud can also determine the effectiveness of the Faraday shield, in addition to the thickness of respective multiple shrouds. However, the gap between the concentric shrouds is needed to form multiple layers to establish the attenuation effect and achieve a complete Faraday shield.

Figure 5:
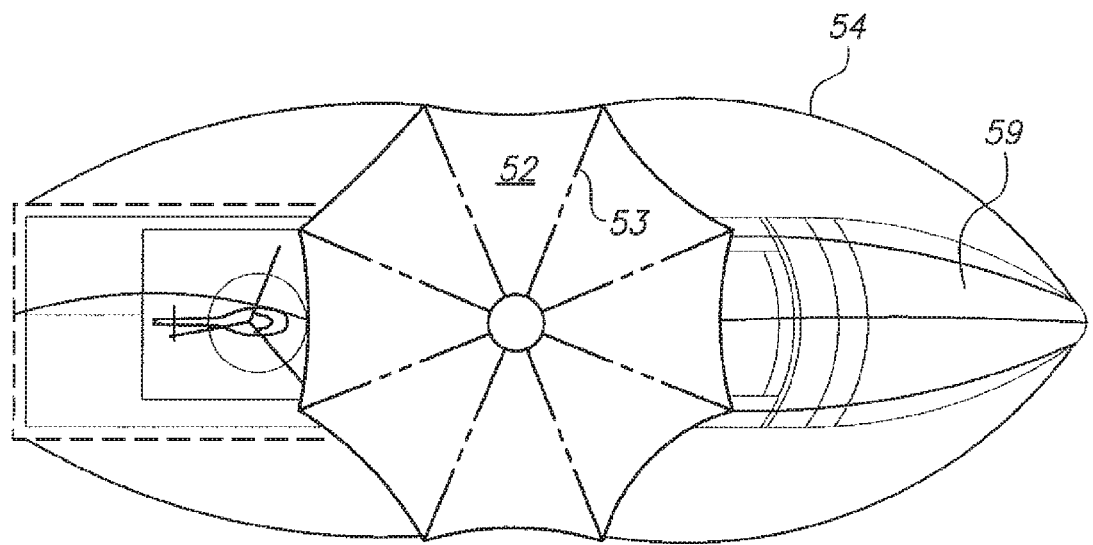
FIG. 5 is a top plan view of a seawater Faraday cage of the present invention, according to several embodiments.
Figure 6:
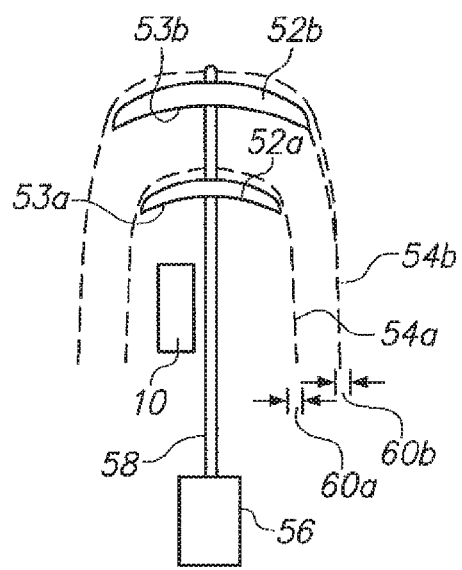
FIG. 6 is a side elevational view of the seawater Faraday cage of FIG. 5.
Figure 7:
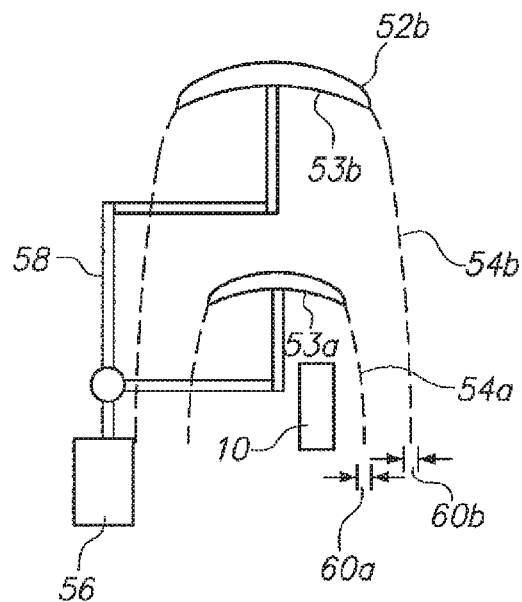
FIG. 7 is a side elevational view of an alternative embodiment of the seawater Faraday cage of FIG. 5.

Referring now to FIGS. 5-7, the seawater Faraday cage 50 of the present invention according to several embodiments is shown and is illustrated. As shown, the cage 50 can include a flexible material 52, which can be draped over a collapsible, umbrella-like framework 53 (shown in phantom in FIG. 5). Collapsible framework 53 can be large enough to cover device 10, or even ship 59 in FIG. 5. Or, multiple collapsible frameworks 53 can be used to cover the entire ship 59. For clarity, only one framework 53 is shown in FIG. 5. A flow of conductive fluid can establish a shroud 54 of conductive fluid, which can cover all or part of the ship and/or device 10 to be protected.

In some embodiments, and as can be seen from FIGS. 6-7, the flexible material 52 (such as canvas, for example) can be divided into a first portion 52a and a second portion 52b, which can be arranged over respective collapsible framework 53a, 53b so that first portion 52a is over device 10 and second portion 52b is over first portion 52a. As shown second portion 52b can have a surface area that can be greater than that of first portion 52a. With this configuration, when flow of conductive fluid is established, the corresponding shrouds 54a and 54b can be established so that first portion 52a would be over device, shroud 54a would enclose the device, second portion 52b would be over shroud 54a (and device) and shroud 54b would enclose shroud 54a (and device 10). Moreover, shrouds 54a and 54b would appear to be concentric when viewed in plan view. To accomplish the seawater flow as described above, a pump 56 can direct conductive fluid through piping 58 and through openings (not shown) above frameworks 53a and 53b. For the embodiment shown in FIG. 6, there can be a single run of piping 58. Alternatively, piping 58 could branch in a manner that allows for a fraction of conductive to flow over first portion 52a and second portion 52b, with sufficient flow rate to establish thickness 60a and 60b for corresponding shrouds 54a and 54b.

Figure 8:
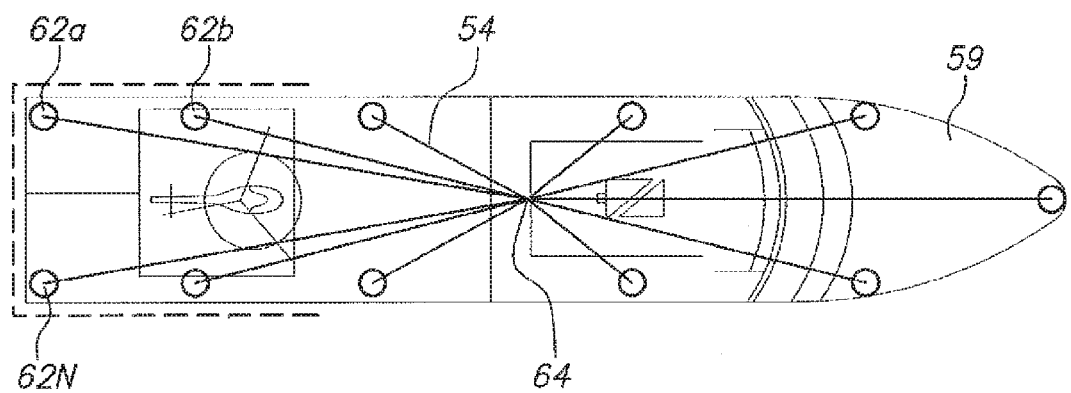
FIG. 8 is a top plan view of still another alternative embodiment of the seawater Faraday cage of the present invention; and, FIG. 9 is a block diagram, which illustrates steps that can be taken to practice the methods of the present invention according to several embodiments.

Referring now to FIG. 8, several alternative embodiments of the present invention can be illustrated. As shown, a plurality of nozzles 62a through 62N, can be established around the perimeter of ship 59 and/or or device 10 to be protected. The nozzles 62 can be constructed with steel, copper or brass in a variety of diameters and heights to accommodate the requirement, and the nozzles 62 can be oriented to direct a flow of conductive fluid to a predetermined point 64. Point 64 can be chosen so that when the streams for nozzles 62 collide, the shroud is established. These embodiments can obviate the need for a framework 53 and flexible material 52 to create shroud 54. Or, the nozzle arrangement could be used in conjunction with framework 53 and flexible material 52 in FIG. 5, instead of piping. Point 62 could be chosen above flexible material 52 and can also be at the geometric center of flexible material 52 (when viewed in top plan, as illustrated in FIG. 5) to thereby establish the shroud 54.

With the above configurations, the seawater Faraday cage of the present invention can be flexible and light weight, when compared to a traditional metal Faraday cages. The seawater Faraday cage of the present invention according to several embodiments can be selectively activated with a flip of switch. In addition, seawater can be used as an inexhaustible supply of conductive fluid without requiring a return line of fluid, i.e. the seawater Faraday cage of the present invention can be an open system in some embodiments, as seawater can be obtained easily from the ocean, the Faraday cage of the present invention can be established, and the seawater can drain overboard during the operation of the seawater Faraday cage, which can be very desirable for Naval applications. It should also be appreciated that the structure and cooperation of structure described above could also be used to provide a fluid Faraday cage over a building or home, providing a conductive fluid source (most likely public works fireman pressure) is available.

Figure 9:
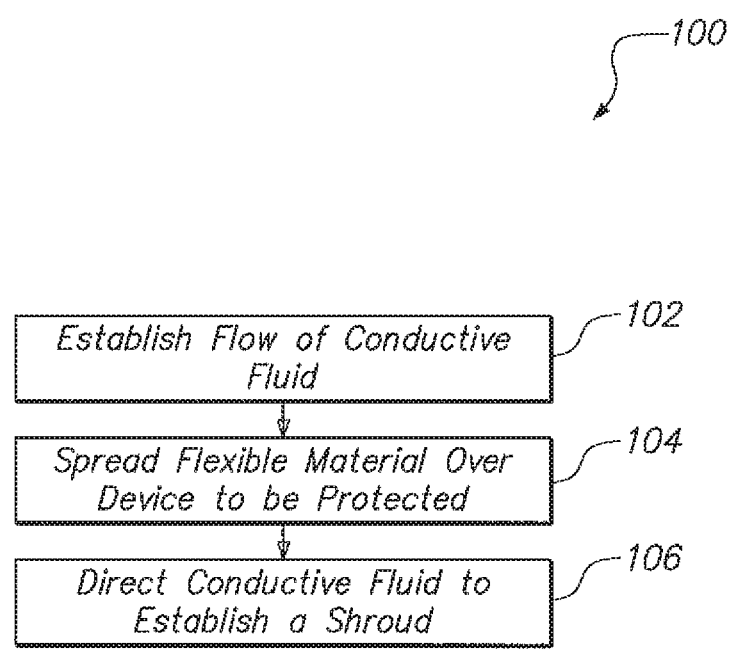

Referring now to FIG. 9, a block diagram 100 is provided to illustrate steps that can be taken to accomplish the methods of the present invention. As shown, the methods can include the initial step 102 of establishing a flow of conductive fluid 102, using the structure and cooperation of structure described above. The methods can further include the additional optional step of spreading a flexible material over the device to be protected, as shown by step 104. The flexible material can be selectively divided into portions and the flow can be divided as described above to establish concentric shrouds, or it can be spread as a single unitary sheet over collapsible framework, as described above.

The methods of several embodiments can further include the step 106 of directing the conductive fluid to establish a shroud 54 over the device 10. Step 106 can be accomplished using the arrangement of piping 58 described above, or the aforementioned plurality of nozzles 62 can be directed at point 64 (with or without flexible material 52 and framework 53), also as described above. Step 106 can be accomplished to establish a shroud, or multiple shrouds, that can have thickness, which can be further selected according to the desired frequency of electromagnetic radiation that can be desired to block.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A Faraday cage for a device, said device having a perimeter, said Faraday cage comprising:
   a flexible material deployed over said device;
   a plurality of nozzles around said perimeter; and,
   said plurality of nozzles directing a conductive fluid flow onto said flexible material to establish a conductive fluid shroud over said device.

2. The Faraday cage of claim 1, wherein said conductive fluid is selected from the group consisting of tap water, saltwater, seawater and distilled water.

3. The Faraday cage of claim 1, wherein said conductive fluid shroud has a first thickness.

4. The Faraday cage of claim 3, wherein said first thickness is chosen according to a desired frequency to be blocked.

5. The Faraday cage of claim 3, wherein said first thickness is between 1-100 millimeters (1-100 mm).

6. The Faraday cage of claim 1, wherein said flexible material further comprises a first portion and a second portion;
- said first portion being located between said second portion and said device;
- said first portion having a first surface area and said second portion having a second surface area that is larger than said first surface area.

7. The Faraday cage of claim 6, wherein said second portion covers said first portion, and said first portion covers said device.

8. The Faraday cage of claim 7, wherein said first thickness is established between said first portion and said second portion, and wherein a fraction of said conductive fluid is diverted to establish a second conductive fluid shroud having a second thickness, so that said second portion is between said first thickness and said second thickness.

* * * * *